United States Patent [19]

Izadinia et al.

[11] Patent Number: 5,032,745
[45] Date of Patent: Jul. 16, 1991

[54] CURRENT SENSING OF DC OR A STEPPER MOTOR

[75] Inventors: Mansour Izadinia, Santa Clara; Paul Ueunten, San Jose, both of Calif.

[73] Assignee: National Semiconductor Corporation, Santa Clara, Calif.

[21] Appl. No.: 314,334

[22] Filed: Feb. 22, 1989

[51] Int. Cl.$^5$ .................... H03K 17/687; H03K 3/01; H03K 17/74; H01L 29/10

[52] U.S. Cl. .................... 307/571; 307/574; 307/270; 307/257; 323/315; 357/23.4

[58] Field of Search .............. 307/571, 572, 573, 575, 307/576, 583, 584, 585, 270, 574, 257; 323/315; 357/23.4

[56] References Cited

U.S. PATENT DOCUMENTS

| | | | |
|---|---|---|---|
| 4,454,454 | 6/1984 | Valentine | 307/584 |
| 4,590,456 | 5/1986 | Burton et al. | 307/585 |
| 4,680,490 | 7/1987 | Baker et al. | 307/575 |

OTHER PUBLICATIONS

Grebene, "Analog Integrated Circuit Design", 1972, pp. 244-245.

Primary Examiner—Stanley D. Miller
Assistant Examiner—Trong Phan
Attorney, Agent, or Firm—Gail W. Woodward; Lee Patch; Michael A. Glenn

[57] ABSTRACT

A H-bridge circuit is disclosed using DMOST switches having current sensing parallel connected elements. An op-amp control circuit is coupled to the power and sense sources to force the sense source to the same potential as the power source. The op-amp circuit drives FET output devices which produce an output current proportional to the H-bridge current. A high voltage op-amp configuration is set forth.

7 Claims, 2 Drawing Sheets

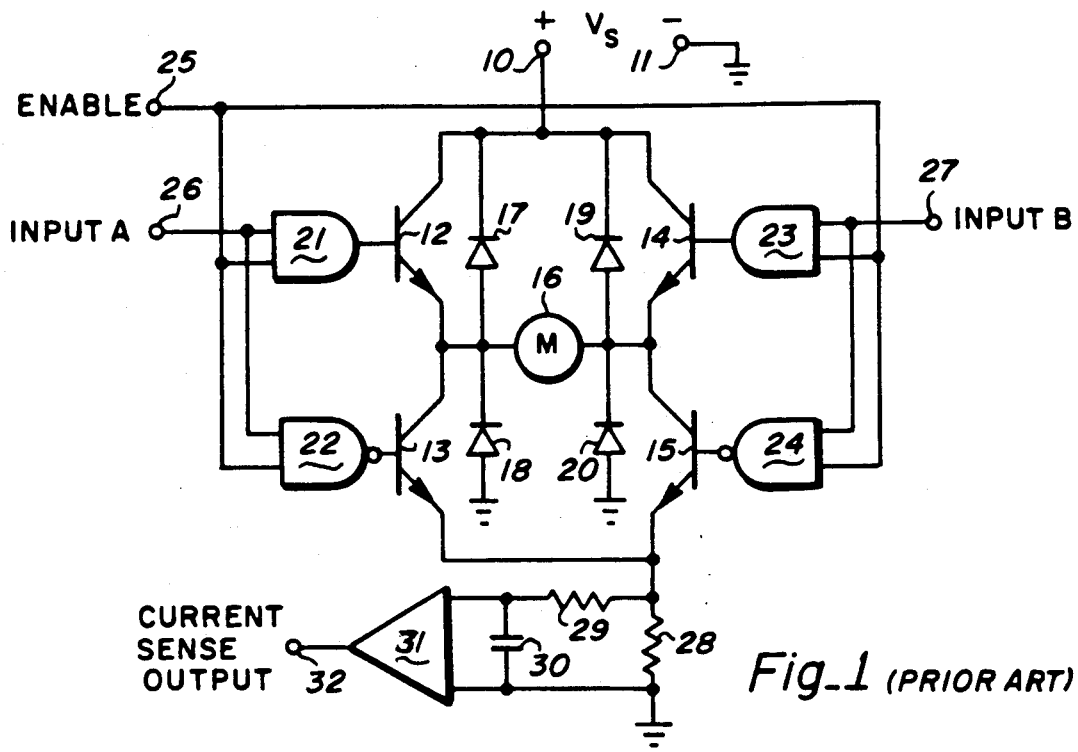
Fig_1 (PRIOR ART)
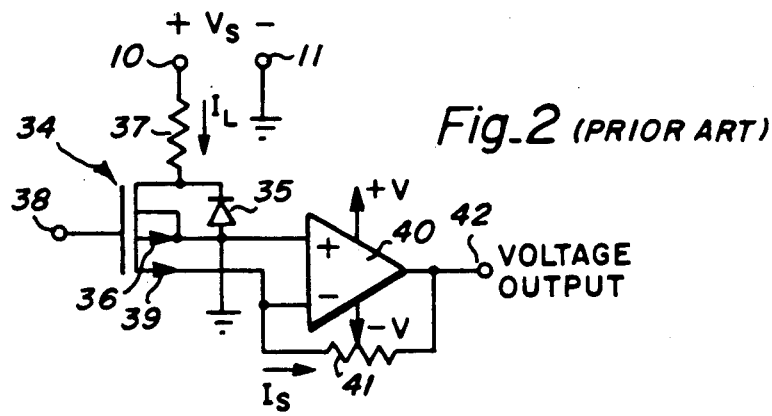
Fig_2 (PRIOR ART)
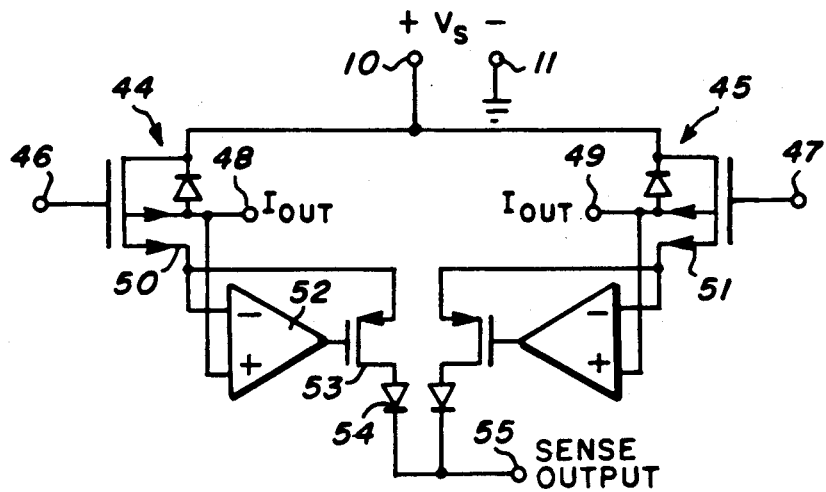
Fig_3

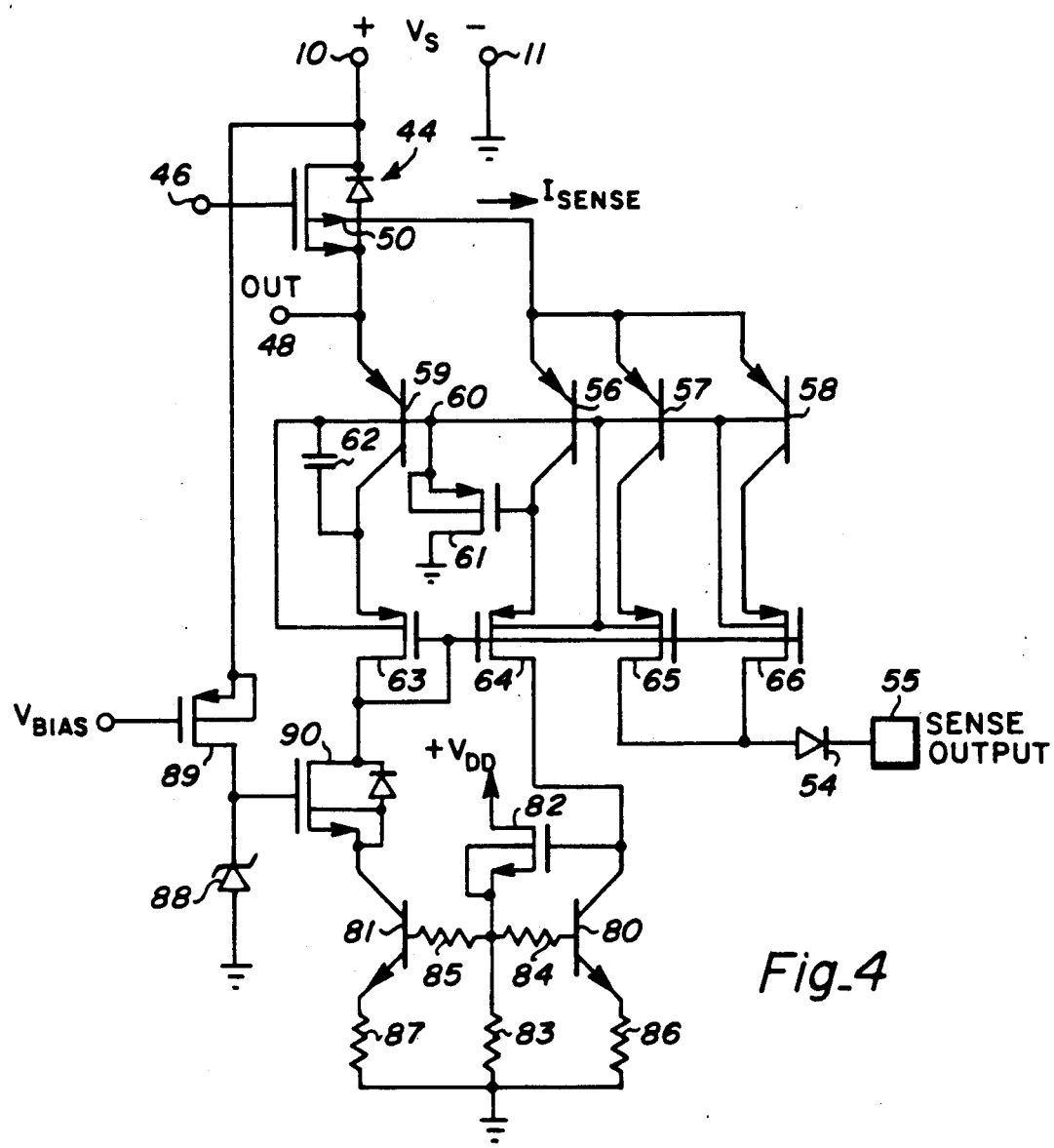
Fig_4
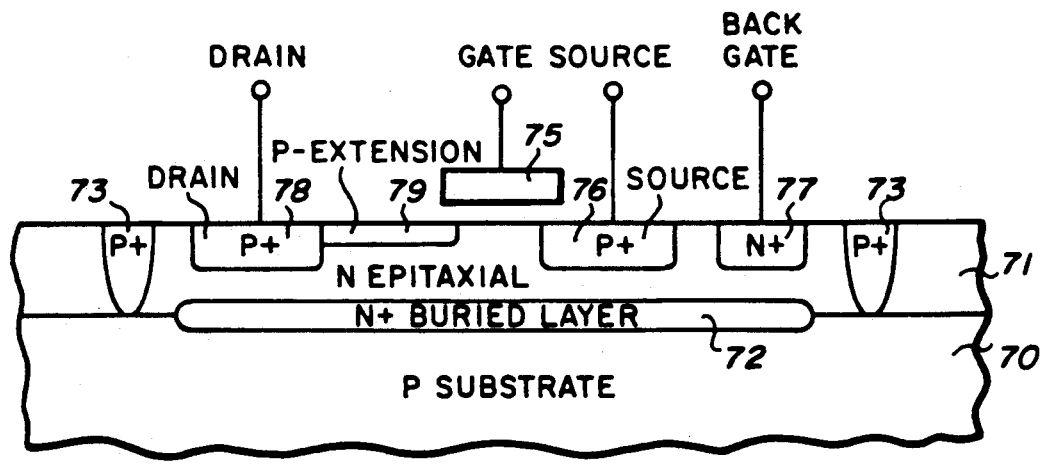
Fig_5

CURRENT SENSING OF DC OR A STEPPER MOTOR

BACKGROUND OF THE INVENTION

In the so-called H bridge, four semiconductor switches form the four legs and the load, which is typically a motor winding, forms the crossbar. When direct current (D) is applied to such a switch the four elements can be operated so as to provide a current through the load in either direction thus controlling its rotation direction. In driving a stepper motor a succession of current pulses can be supplied for incrementing the motor as desired.

FIG. 1 illustrates a typical prior art monolithic integrated circuit (IC) H bridge. DC is applied + to terminal 10 and − to ground terminal 11. Four NPN transistors 12-15 form the 14 four legs of the H bridge and motor 16 forms the crossbar. Since the motor winding is inductive four clamp diodes 17-20 are included to absorb any inductive kickback transients. In the H bridge configuration transistors 12 and 14 are referred to as the top-side drivers while transistors 13 and 15 are referred to as the bottom-side drivers. Logic elements 21-24 control the conduction of switch elements 12-15 in response to control signals applied at terminals 25-27. In order to monitor the H bridge current it has become common to include a series resistor 28 which passes the total bridge current. Typically, this is a separate low value precision resistor that is exterior to any IC construction. It is clear that any voltage drop across resistor 28 is parasitic in that it detracts from the voltage applied to motor 16. The voltage that appears across resistor 28 is integrated by resistor 29 and capacitor 30. Amplifier 31 senses the voltage across capacitor 30 and provides a bridge current readout at current sense terminal 32.

While FIG. 1 shows the use of NPN power transistors 12-15 such elements are not ideal. They require separate external clamp diodes and are slow to turn off. It has been found that if transistors 12-15 are replaced with diffused metal oxide semiconductor transistors (DMOST's) several clear advantages occur. First, a DMOST incorporates its own clamp diode and no separate diode is needed. The DMOST also has a very low on resistance and can switch rapidly. Finally, the DMOST can employ a built in current sense as shown in FIG. 2. Here DMOST 34 is shown schematically to include its built-in clamp diode 35. The power source 36 is connected to its backgate and is shown grounded in a bottom-side switching application. A load element 37 returns the drain to the positive supply terminal 10. $I_L$ flows in the load and in the main DMOST source 36 in response to a control bias applied to gate input 38. An additional sense source 39 is included in the DMOST structure. Typically, a DMOST is composed of a large number of individual low current segments which are connected in parallel by IC metallization. For example, several thousand low current elements can be joined together to create a high current DMOST suitable for use in a H bridge. A single such element, separate from the rest, can then provide a sense current that is a small controlled fraction of the current being passed in the large area device. An op-amp 40 has its inputs coupled to DMOST sources 36 and 39. A resistor 41 is coupled from the output of op-amp 40 to its inverting input to provide negative feedback to the inverting input which is connected to the sense source 39. Thus, op-amp 41 will drive output terminal 42 until the potentials on sources 36 and 39 are equal. Under this condition $I_S$ will flow in resistor 41. The voltage at terminal 42 will then be at $I_S.R41$. Since the potential at terminal 42 is below ground, op-amp 40 must be provided with positive and negative supplies as shown.

SUMMARY OF THE INVENTION

It is an object of the invention to employ DMOST structures as top side H-bridge drivers in a configuration where a sense source current is coupled to a current sense output terminal in a circuit that forces the sense source to the same potential as the power source.

It is a further object of the invention to employ a pair of dual source DMOST's in a top side H bridge driver configuration wherein each DMOST has its sense source coupled to a current sensing circuit that forces the sense source to the potential of the power source and wherein the circuit provides a current output which is related to the sum of the DMOST sense source currents.

These and other objects are achieved in a circuit configured as follows. The DMOST top side H-bridge drivers each has a power source and a sense source coupled to the inputs of an op-amp which includes a negative feedback loop that will drive the differential inputs to the same potential. The op-amps includes FET outputs which pass the sense source currents. The two currents that are produced by the circuits associated with the top side H-bridge drivers are ORed together by a pair of diodes which couple the sense currents to a current sense output terminal. Since the total H-bridge current must flow in the top-side drivers the circuit produces a current proportional to the total H-bridge current without using a series resistor or a dual low voltage supply.

BRIEF DESCRIPTION OF THE DRAWING

FIG. 1 is a schematic-block diagram of a well known prior art H-bridge circuit.

FIG. 2 is a schematic-block diagram of a prior art DMOST driver showing the use of a current sense source.

FIG. 3 is a schematic-block diagram of a top-side H-bridge current sense circuit in accordance with the invention.

FIG. 4 is a schematic diagram of the op-amp employed in practicing the invention.

FIG. 5 is a cross section of a fragment of an IC chip in which a high voltage P channel transistor is fabricated for use in the circuit of FIG. 4.

DESCRIPTION OF THE INVENTION

In the description as follows, it is intended that a compatible CMOS structure be employed to fabricate the various circuit elements. An epitaxial layer form of construction is preferred and PN junction isolation diffusion, employed in the well known manner, is used to provide isolated tubs of semiconductor material. Active devices can then be fabricated into these tubs to form the circuit elements.

With reference to FIG. 3, a functional showing of the invention is disclosed in a combined schematic block diagram. Only the top-side H-bridge drivers 44 and 45 are shown. These large area DMOST devices are respectively controlled in the conventional manner at drive terminals 46 and 47. While not shown, bottom-side drivers will be connected to output terminals 48 and 49 to complete the H-bridge return to ground. Sense sources 50 and 51 are associated with the drivers, as well known in the art, to provide a current that is a known fraction of the currents flowing in the power sources of DMOST's 44 and 45.

The two sources in DMOST 44 are connected to the input terminals of op-amp 52 which in turn drives the gate of P MOST 53. Note that sense source 50 is connected to the inverting input. Since the source of PMOST 53 is connected to the same input, it is clear that a 100% negative feedback loop is present. Op-amp 52 will operate to force the inverting input to the same potential as its noninverting input thus equalizing the DMOST source potentials. It can also be seen that any current flowing in sense source 50 will also flow in PMOST 53. Diode 54 will couple the current flowing in PMOST 53 to output terminal 55. A similar set of components connected to DMOST 45 will pass any current flowing in sense source 51 to output terminal 55. This, the current output is the sum of the currents flowing in sense sources 50 and 51. Note that at any instant of time either DMOST 44 or 45 will be conducting current, thus the current out of pin 55 is the OR function of transistor currents 44 and 45 because the two diodes connected to pin 55 perform the well known logic OR function.

FIG. 4 shows an operational amplifier suitable for practicing the invention. Where the parts function the same as those of FIG. 3, the same designations are used. DMOST 44 is one of the top-side drivers. The power source is returned to terminal 48 which couples to the remainder of the H-bridge circuit Sense source 50 is coupled to the emitters of transistors 56–58 The power source is coupled to the emitter of transistor 59.

Transistors 56 and 59 form a differential input stage with each one drawing $I_{SENSE}/3$. Transistor 61 couples the collector of transistor 56 back to node 60 and therefore provides 100% negative feedback. Thus, the op-amp will drive node 60 to that level where the conduction in transistor 59 equals that in transistor 56. For this condition, the emitters of transistors 56 and 59 will be at the same potentials. Capacitor 62 frequency compensates the op-amp in the conventional manner so that its gain falls with increasing frequency.

P channel transistors 63–66 are cascode connected with transistors 56–59 and each one has its back gate connection returned to node 60. Transistors (61, 63–66) are not ordinary P channel devices. They are of high-voltage construction as shown in FIG. 5. The typical PMOS transistor has a drain breakdown voltage of about 35 volts. This low value is due to the fact that the gate slightly overlaps the drain and thus sets up an associated electric field that triggers a low breakdown. As shown in FIG. 5, the P+ drain is offset from the gate region and a lightly doped or P− region joins the drain to the gate region.

FIG. 5 is a cross-section showing of a silicon wafer fragment that contains a high voltage P channel transistor. The various device elements are shown, but the oxide, or passivation and metallization, have been removed for clarity. The various metal connections are shown in schematic form.

A P type substrate wafer 70 has an epitaxial N type layer 71 grown thereon. The active device is located over an N+ buried layer 72. Such buried layers are well-known in he IC art. The epitaxial layer is divided into tubs by means of P+ isolation diffusion 73 which exists here as a ring that surrounds buried layer 72. A P+ source diffusion 76 extends into the epitaxial N type tub adjacent to a gate region defined by the gate 75. An N+ diffusion 77 extends into the epitaxial N type tub to form an ohmic contact therewith. This is the transistor back gate connection. The P+ drain region 78 is offset from the gate and, as shown, a P− or lightly doped extension 79, electrically joins the drain region 78 with the gate region. The device shown in FIG. 5 has a typical drain breakdown of greater than 80 volts which is over twice that of a conventional P channel transistor.

The use of high voltage P channel transistors in the circuit is important in extending the H-switch input or supply voltage range. The circuit shown in FIGS. 3 and 4 can operate in the range of 12 to 60 volts. Transistor 44 is made large enough for the H-switch to pass a steady state current of 3 amperes. In the preferred embodiment the current sense source is 1/1500 of the area of the power source. Thus, $I_{SENSE}$ has a maximum value o 1.33 milliamperes.

NPN transistors 80 and 81 form a current mirror load for the op-amp output. Transistor 82, which has its drain returned to a low voltage supply, $V_{DD}$ acts as a source follower. Functionally it returns the collector of transistor 80 to its base thereby forcing it to operate as a current mirror input diode The current flowing in transistor 56, and cascode transistor 64, flows in this current mirror input. The reflected current will flow in transistor 81, which will conduct the current flowing in transistor 59 and its cascode transistor 63. DMOST 90 is of standard construction and is coupled to pass the current flowing in transistor 81. This device is necessary to support a high supply voltage because the gate of transistor 63 is connected to its drain.

Resistor 83 is present to return the source of N channel transistor 82 to ground while resistors 84 and 85 are low value isolation resistors in the bases respectively of transistors 80 and 81. Low value resistors 86 and 87 return the emitters of transistors 80 and 81 to ground respectively and complete the current mirror circuit.

Transistor 90 is present to limit the collector voltage on transistor 81 which has a typical collector breakdown on the order of 40 volts. The gate of transistor 90 is connected to zener diode 88 which operates at a level of about 10 volts. Thus, the collector of transistor 81 is limited to the zener diode voltage less the threshold voltage of transistor 90. Transistor 89, which is a high voltage P channel transistor of the construction of FIG. 5, has its source returned to terminal 10 or $+V_S$. Its drain passes a small reverse current through zener diode 88 thereby biasing it into its zener breakdown. The gate of transistor 89 is returned to a bias voltage source operating at about one threshold below $V_S$.

It can be seen that the op-amp circuit, along with its current mirror load, will force sense source 50 to the potential of the power source of transistor 44. Under quiescent conditions $I_{SENSE}/3$ will flow in transistor 56 (and transistor 59). A similar value will also flow in the emitters of transistors 57 and 58. Thus, a current of $2I_{SENSE}/3$ will flow in combined transistors 57 and 58 along with their cascode connected transistors 65 and 66. Therefore, the current flowing in output terminal 55 will be directly related to the H-switch current flowing in transistor 44.

The invention has been described and a detailed preferred embodiment set forth. When a person skilled in the art reads the foregoing description, alternatives and equivalents, within the spirit and intent of the invention, will be apparent. Accordingly, it is intended that the scope of the invention be limited only by the following claims.

We claim:

1. A power switch employing diffused metal oxide semiconductor transistor (DMOST) elements suitable for switching the current in a high power load, said switch comprising:

a DMOST composed of a plurality of small individual transistor elements connected in parallel by means of metallization which in combination provide sufficient conduction to perform said switching, said DMOST having a power source, a drain and a gate;

a sense transistor associated with said DMOST and consisting of separately relatively small area gate and drain elements respectively connected by said metallization to said DMOST gate and said DMOST drain thereby to provide a separate sense source that produces a sense current representing a geometry controlled fraction of the current flowing in said DMOST;

means coupled to said sense source and to said power source for forcing said sense source to the same potential as said power source; and means coupled to said sense source for responding to the current flowing in said sense source to provide an output current directly proportional to said sense current.

2. The power switch of claim 1 wherein said DMOST is repeated four times to create an H-switch in which the four vertical legs each comprise a DMOST and the horizontal leg comprises said high power load wherein said output current is directly related to the current flowing is said H-switch.

3. The power switch of claim 2 wherein the two upper vertical legs of the H-switch each comprise a DMOST and said output current is directly related to the sum of the DMOST sense currents thereby produced.

4. The power switch of claim 1 further including an operational amplifier having inverting and noninverting input terminals and an output terminal wherein said DMOST power source and said DMOST sense source are coupled to the input terminals of said differentional amplifier the output terminal of which is coupled to the inverting input to provide negative feedback and the current flowing in said sense emitter is caused to flow in said feedback circuit which also provides said output current.

5. The power switch of claim 4 wherein said operational amplifier includes an input stage which comprises differentially operated bipolar transistors driven at their emitters.

6. The power switch of claim 5 wherein said bipolar transistors are coupled to a current mirror load.

7. The power switch of claim 6 wherein said bipolar transistors are coupled to said current mirror load by means of cascode connected monopolar field effect transistors.

* * * * *